(12) United States Patent
Zhou

(10) Patent No.: US 10,367,016 B2
(45) Date of Patent: Jul. 30, 2019

(54) METHOD FOR MANUFACTURING TFT SUBSTRATE

(71) Applicant: SHENZHEN CHINA STAR OPTOELECTRONICS TECHNOLOGY CO., LTD., Shenzhen (CN)

(72) Inventor: Zhichao Zhou, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/570,754

(22) PCT Filed: May 3, 2017

(86) PCT No.: PCT/CN2017/082815
§ 371 (c)(1),
(2) Date: Oct. 31, 2017

(87) PCT Pub. No.: WO2018/176568
PCT Pub. Date: Oct. 4, 2018

(65) Prior Publication Data
US 2018/0366497 A1 Dec. 20, 2018

(30) Foreign Application Priority Data
Apr. 1, 2017 (CN) .......................... 2017 1 0212917

(51) Int. Cl.
*H01L 21/02* (2006.01)
*H01L 27/12* (2006.01)
(Continued)

(52) U.S. Cl.
CPC ...... *H01L 27/1288* (2013.01); *H01L 21/0272* (2013.01); *H01L 21/0274* (2013.01); *H01L 21/02565* (2013.01); *H01L 21/02631* (2013.01); *H01L 21/443* (2013.01); *H01L 21/47573* (2013.01); *H01L 24/45* (2013.01);
(Continued)

(58) Field of Classification Search
CPC ............. H01L 27/1288; H01L 27/1214; H01L 29/41733; H01L 29/4908; H01L 21/31144; H01L 21/443; H01L 27/1262; H01L 21/0274; H01L 27/127; H01L 21/0272; H01L 21/47573; H01L 21/02631; H01L 27/1225; H01L 24/45; H01L 29/7869; H01L 29/66969; H01L 29/24; H01L 21/02565; H01L 27/124
See application file for complete search history.

(56) References Cited

U.S. PATENT DOCUMENTS 10,090,414 B2 * 10/2018 Lu ..................... H01L 29/78603

* cited by examiner

*Primary Examiner* — Roy K Potter
(74) *Attorney, Agent, or Firm* — JMB Davis Ben-David

(57) ABSTRACT

A method for manufacturing a TFT (Thin-Film Transistor) substrate is proposed. The method includes utilizing a first photomask process to form a buffer layer, a data line, a source electrode, a first scan line, a second scan line, and a gate electrode on a substrate; utilizing a second photomask process to form a first insulation layer, a second insulation layer, a first semiconductor layer, and a second semiconductor layer on the substrate; and utilizing a third photomask process to form a first conductor layer, an electrical connection portion, and a drain electrode on the substrate.

20 Claims, 6 Drawing Sheets

(51) Int. Cl.
  *H01L 21/443* (2006.01)
  *H01L 21/027* (2006.01)
  *H01L 21/4757* (2006.01)
  *H01L 23/00* (2006.01)
  *H01L 29/786* (2006.01)
  *H01L 29/66* (2006.01)
  *H01L 29/24* (2006.01)
(52) U.S. Cl.
  CPC .......... *H01L 27/124* (2013.01); *H01L 27/127* (2013.01); *H01L 27/1225* (2013.01); *H01L 27/1262* (2013.01); *H01L 29/24* (2013.01); *H01L 29/66969* (2013.01); *H01L 29/7869* (2013.01)

METHOD FOR MANUFACTURING TFT SUBSTRATE

CROSS-REFERENCE TO RELATED APPLICATIONS

This is the U.S. National Stage of International Patent Application No. PCT/CN2017/082815, filed May 3, 2017, which in turn claims the benefit of Chinese Patent Application No. 201710212917.1, filed Apr. 1, 2017.

TECHNICAL FIELD OF THE DISCLOSURE

The present disclosure relates to liquid crystal panel manufacture, and more particularly, to a method for manufacturing a TFT (Thin-Film transistor) substrate.

BACKGROUND OF THE DISCLOSURE

In current information society, the importance of a display device serving as a visual information transmission medium is further strengthened. In order to dominate in the future, the display device is advanced to be lighter, thinner, lower power consumption, low cost, and better image quality.

In the liquid crystal panel industry, a TFT substrate is used to control the arrangement of liquid crystal molecules to carry out presentation of different gray levels. The TFT substrate is an important component of a liquid crystal panel as well as its production is an important process in manufacturing the liquid crystal panel.

With the development of TFT technology, the number of required photomasks is reduced from 5/6 masks down to the current 4 masks. Whenever one mask is reduced, the cost of machine, material, and process time will fall in a great deal and product competitiveness is greatly enhanced. Because one mask is saved, a 3-mask TFT technology leads to a dramatical reduction of cost, and the relevant technology is more popular.

In related arts, a TFT substrate with a ring-shaped gate structure has a superior performance, and attracts more and more people's attention. However, the processes adopted in mass producing the TFT substrate with the ring-shaped gate structure are complicated, resulting in a high manufacture cost.

Therefore, there is a need to improve the drawbacks in the existing skills.

SUMMARY OF THE DISCLOSURE

The objective of the present disclosure is to provide an improved method for manufacturing a TFT substrate.

To solve above problems, the technical schemes provided by the present invention are described below.

The present disclosure provides a method for manufacturing a TFT substrate, comprising steps of:
providing a substrate;
utilizing a first photomask process to form a buffer layer, a data line, and a source electrode on the substrate and dispose a first scan line, a second scan line, and a gate electrode on the buffer layer, the data line configured to electrically connect to the source electrode, the second scan line configured to electrically connect to the gate electrode, and the gate electrode being shaped as a bulk and surrounding the source electrode;
utilizing a second photomask process to form a first insulation layer on the buffer layer and the gate electrode, form a second insulation layer on the data line, form a first semiconductor layer on the first scan line and the second scan line, and form a second semiconductor layer on the source electrode;
coating a photoresist material on the substrate, and utilizing a third photomask process to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer;
making the first semiconductor layer become a conductor to form a first conductor layer, and removing the first photoresist layer;
removing the second photoresist layer after a second conductor layer is formed on the substrate, to form an electrical connection portion on the first conductor layer and the second insulation layer and form a drain electrode on the second semiconductor layer, wherein the electrical connection portion makes the first scan line and the second scan line connected to each other via the first conductor layer.

In some embodiments, forming the buffer layer, the data line, and the source electrode on the substrate and disposing the first scan line, the second scan line, and the gate electrode on the buffer layer comprising:
forming the buffer layer on the substrate;
coating the photoresist material on the buffer layer;
utilizing a photolithography process and an etching process to form a first scan region, a second scan region, a gate electrode region, a data line region, and a source electrode region;
peeling off the photoresist material after a metal layer is deposited on the substrate, to form the first scan line in the first scan region, form the second scan line in the second scan region, form the gate electrode in the gate electrode region, form the data line in the data line region, and form the source electrode in the source electrode region.

In some embodiments, forming the first insulation layer on the buffer layer and the gate electrode, forming the second insulation layer on the data line, forming the first semiconductor layer on the first scan line and the second scan line, and forming the second semiconductor layer on the source electrode, comprising:
forming an insulation material layer on the substrate;
patterning the insulation material layer to expose the first scan line, the second scan line, and the source electrode, form the first insulation layer on the buffer layer and the gate electrode, and form the second insulation layer on the data line;
forming the first semiconductor layer on the first scan line and the second scan line and forming the second semiconductor layer on the source electrode.

In some embodiments, patterning the insulation material layer comprising:
coating the photoresist material on the substrate;
Utilizing the photolithography process to expose the insulation material layer on the first scan line, the second scan line, and the source electrode by using a full exposure applied to the photoresist material on the insulation material layer on the first scan line, the second scan line, and the source electrode;
utilizing the etching process to etch the insulation material layer on the first scan line, the second scan line, and the source electrode.

In some embodiments, forming the first semiconductor layer on the first scan line and the second scan line and forming the second semiconductor layer on the source electrode comprising:

utilizing physical vapor deposition to form the first semiconductor layer on the first scan line and the second scan line and form the second semiconductor layer on the source electrode.

In some embodiments, making the first semiconductor layer become the conductor to form the first conductor layer and removing the first photoresist layer, comprising:

making the first semiconductor layer become the conductor to form the first conductor layer;

ashing the photoresist material to remove the first photoresist layer.

In some embodiments, removing the second photoresist layer after the second conductor layer is formed on the substrate, comprising:

utilizing physical vapor deposition to deposit the second conductor layer on the substrate;

utilizing a photoresist peeling-off process to remove the second photoresist layer.

In some embodiments, the material of the first semiconductor layer and the second semiconductor layer comprises indium gallium zinc oxide.

In some embodiments, the material of the second conductor layer comprises indium tin oxide.

In some embodiments, the buffer layer is a silicon nitride layer, a silicon oxide layer, or an aluminum oxide layer.

The present disclosure further provides another method for manufacturing a TFT substrate, comprising steps of:

providing a substrate;

forming a buffer layer on the substrate and coating a photoresist material on the buffer layer, and utilizing a first photomask process to form a first scan region, a second scan region, a gate electrode region, a data line region, and a source electrode region by a photolithography process and an etching process;

peeling off the photoresist material after a metal layer is deposited on the substrate, to form a first scan line in the first scan region, form a second scan line in the second scan region, form a gate electrode in the gate electrode region, form a data line in the data line region, and form a source electrode in the source electrode region, the data line configured to electrically connect to the source electrode, the second scan line configured to electrically connect to the gate electrode, and the gate electrode being shaped as a bulk and surrounding the source electrode;

forming an insulation material layer on the substrate, and utilizing a second photomask process to pattern the insulation material layer to expose the first scan line, the second scan line, and the source electrode, and to form a first insulation layer on the buffer layer and the gate electrode, form a second insulation layer on the data line, form a first semiconductor layer on the first scan line and the second scan line, and form a second semiconductor layer on the source electrode;

coating the photoresist material on the substrate, and utilizing a third photomask process to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer;

making the first semiconductor layer become a conductor to form a first conductor layer, and removing the first photoresist layer;

removing the second photoresist layer after a second conductor layer is formed on the substrate, to form an electrical connection portion on the first conductor layer and the second insulation layer and form a drain electrode on the second semiconductor layer, wherein the electrical connection portion makes the first scan line and the second scan line connected to each other via the first conductor layer.

In some embodiments, patterning the insulation material layer comprising:

coating the photoresist material on the substrate;

Utilizing the photolithography process to expose the insulation material layer on the first scan line, the second scan line, and the source electrode by using a full exposure applied to the photoresist material on the insulation material layer on the first scan line, the second scan line, and the source electrode;

utilizing the etching process to etch the insulation material layer on the first scan line, the second scan line, and the source electrode.

In some embodiments, forming the first semiconductor layer on the first scan line and the second scan line and forming the second semiconductor layer on the source electrode comprising:

utilizing physical vapor deposition to form the first semiconductor layer on the first scan line and the second scan line and form the second semiconductor layer on the source electrode.

In some embodiments, making the first semiconductor layer become the conductor to form the first conductor layer and removing the first photoresist layer, comprising:

making the first semiconductor layer become the conductor to form the first conductor layer;

ashing the photoresist material to remove the first photoresist layer.

In some embodiments, making the first semiconductor layer become the conductor to form the first conductor layer comprising:

Utilizing argon, nitrogen, and ammonia gases to make the first semiconductor layer become the conductor to form the first conductor layer.

In some embodiments, removing the second photoresist layer after the second conductor layer is formed on the substrate, comprising:

utilizing physical vapor deposition to deposit the second conductor layer on the substrate;

utilizing a photoresist peeling-off process to remove the second photoresist layer.

In some embodiments, the material of the first semiconductor layer and the second semiconductor layer comprises indium gallium zinc oxide.

In some embodiments, the material of the second conductor layer comprises indium tin oxide.

In some embodiments, the buffer layer is a silicon nitride layer, a silicon oxide layer, or an aluminum oxide layer.

In some embodiments, the thickness of the second photoresist layer is greater than that of the first photoresist layer.

Compared to the existing TFT substrate manufacture method, the present disclosure utilizes a first photomask process to form a buffer layer, a data line, and a source electrode on the substrate and dispose a first scan line, a second scan line, and a gate electrode on the buffer layer. The data line is configured to electrically connect to the source electrode, the second scan line is configured to electrically connect to the gate electrode, and the gate electrode is shaped as a bulk and surrounding the source electrode.

A second photomask process is utilized to form a first insulation layer on the buffer layer and the gate electrode, form a second insulation layer on the data line, form a first semiconductor layer on the first scan line and the second scan line, and form a second semiconductor layer on the source electrode. A photoresist material is coated on the substrate, and then a third photomask process is utilized to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer. Also, the first semiconductor layer becomes a conductor to form a first conductor layer, and the first photoresist layer is removed. Also, the second photoresist layer is removed after a second conductor layer is formed on the substrate, to form an electrical connection portion on the first conductor layer and the second insulation layer and form a drain electrode on the second semiconductor layer. The electrical connection portion makes the first scan line and the second scan line connected to each other via the first conductor layer. This solution uses three photomask processes. The exposed first semiconductor layer becomes a conductor. The overall process is simple, product yield is increased, and the manufacture cost is reduced as well.

DETAILED DESCRIPTION OF THE DISCLOSURE

The following descriptions for the respective embodiments are specific embodiments capable of being implemented for illustrating the present disclosure with referring to the appending figures. In descripting the present disclosure, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present disclosure for ease of understanding, but are not intended to limit the present disclosure.

In the appending drawings, modules with similar structures are indicated by same reference numbers.

In addition, terms such as "first" and "second" are used herein for purposes of description and are not intended to indicate or imply relative importance or imply the number of features. Thus, features limited by "first" and "second" are intended to indicate or imply including one or more than one features. In the description of the present disclosure, "a plurality of" relates to two or more than two, unless specified or limited otherwise. Additionally, terms such as "comprising" and "having" as well as any of their deformation is intended to cover non-exclusive inclusion.

Figure 1:
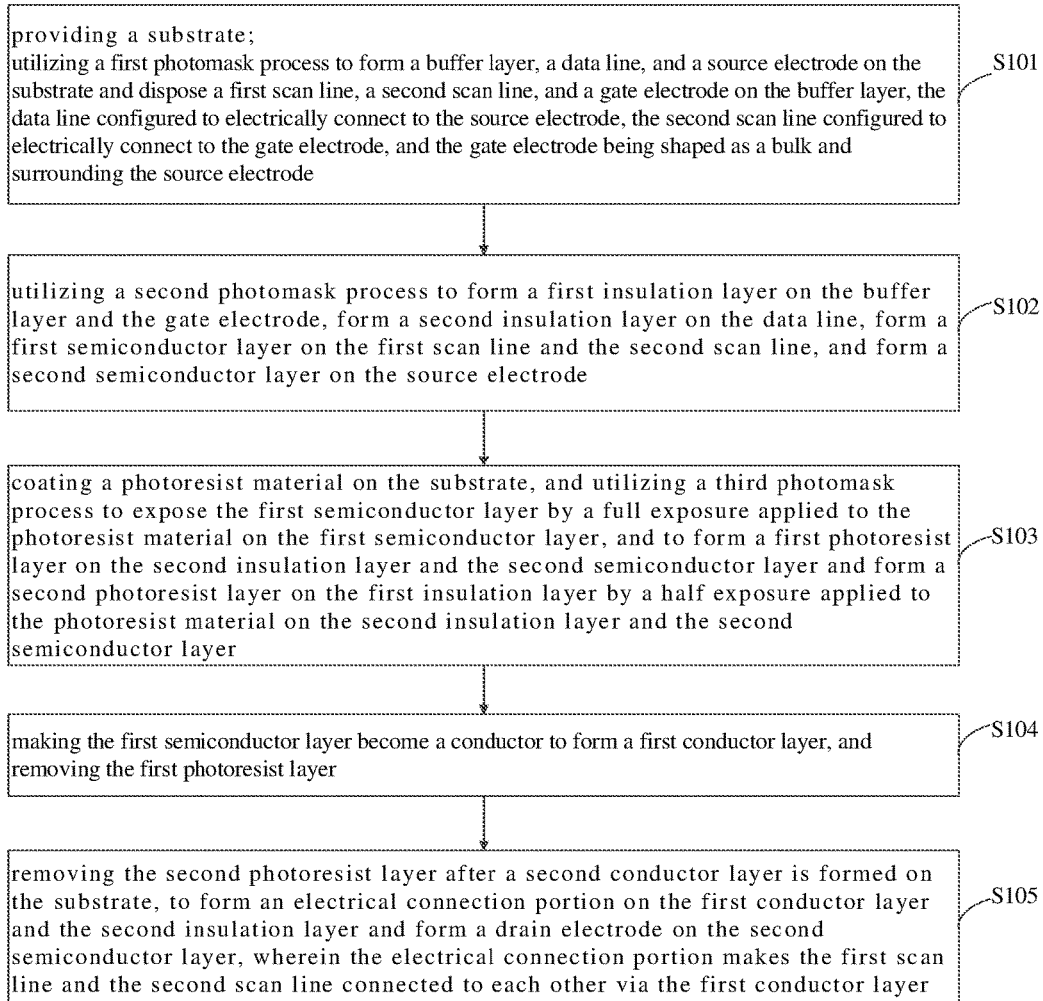
FIG. 1 is a flow chart of a method for manufacturing a TFT substrate in accordance with a preferred embodiment of the present disclosure.

FIG. 1 is a flow chart of a method for manufacturing a TFT substrate in accordance with a preferred embodiment of the present disclosure. As shown in FIG. 1, the TFT substrate manufacture method of the present preferred embodiment includes the following steps.

S101—providing a substrate, forming a buffer layer, a data line, and a source electrode on the substrate using a first photomask process, and disposing a first scan line, a second scan line, and a gate electrode on the buffer layer, the data line configured to electrically connect to the source electrode, the second scan line configured to electrically connect to the gate electrode, and the gate electrode being shaped as a bulk and surrounding the source electrode;

S102—forming a first insulation layer on the buffer layer and the gate electrode using a second photomask process, forming a second insulation layer on the data line, forming a first semiconductor layer on the first scan line and the second scan line, and forming a second semiconductor layer on the source electrode;

S103—coating a photoresist material on the substrate, and utilizing a third photomask process to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer;

S104—making the first semiconductor layer become a conductor to form a first conductor layer, and removing the first photoresist layer;

S105—removing the second photoresist layer after a second conductor layer is formed on the substrate, to form an electrical connection portion on the first conductor layer and the second insulation layer and form a drain electrode on the second semiconductor layer, the electrical connection portion making the first scan line and the second scan line connected to each other via the first conductor layer.

Figure 2A:
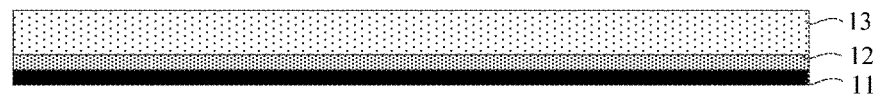
FIGS. 2A to 2E are schematic structural diagrams showing a first photomask process used to form a substrate in the TFT substrate manufacture method shown in FIG. 1.
Figure 2B:
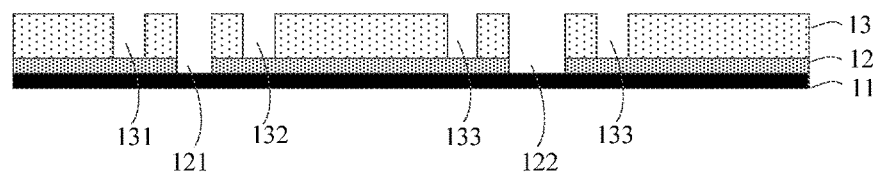
Figure 2C:
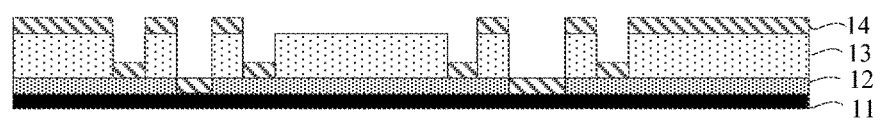
Figure 2D:
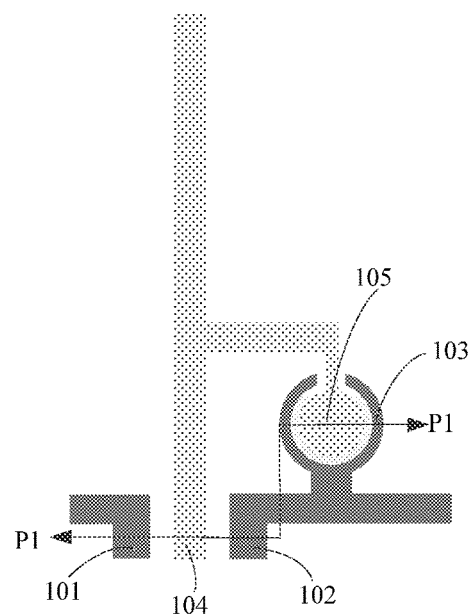
Figure 2E:
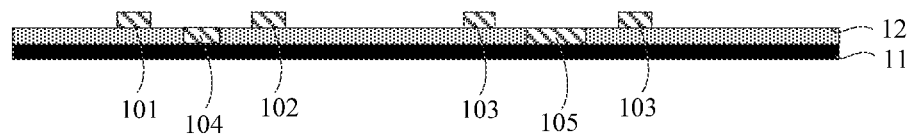

In some embodiments, Step S101 is referred to FIGS. 2A to 2E. FIGS. 2A to 2E are schematic structural diagrams showing a first photomask process used to form a substrate in the TFT substrate manufacture method shown in FIG. 1. FIG. 2D is a top view of an array substrate. FIG. 2E is a cross-sectional view of the array substrate along P1-P1 direction.

As shown in FIG. 2A, a substrate 11 is provided and a buffer layer 12 is formed on the substrate 11. Then, a photoresist material 13 is coated on the buffer layer 12.

As shown in FIG. 2B, a first scan region 131, a second scan region 132, a gate electrode region 133A, a gate electrode region 133B, a data line region 121, and a source electrode region 122 are formed by half exposure, full exposure, etching, and photoresist ashing processes.

Next, as shown in FIG. 2C, a metal layer 14 is formed on the substrate 11 to cover the first scan region 131, the second scan region 132, the gate electrode region 133A, the gate electrode region 133B, the data line region 121, and the source electrode region 122 by using physical vapor deposition. The material of the metal layer 14 can be copper/molybdenum, aluminum/molybdenum, or titanium molybdenum alloy/copper.

Finally, with reference to FIGS. 2D and 2E, the photoresist material 13 and the metal layer 14 on the photoresist material 13 are removed by using a peeling-off process so as to form a first scan line 101 in the first scan region 131, form a second scan line 102 in the second scan region 132, form a gate electrode 103 in the gate electrode regions 133A and 133B, form a data line 104 in the data line region 134, and form a source electrode 105 in the source electrode region 122. The data line 104 is electrically connected to the source electrode 105. The second scan line 102 is electrically connected to the gate electrode 103. The gate electrode 103 is shaped as a bulk and surrounds the source electrode 105.

In some embodiments, Step S102 is referred to FIGS. 3A to 3E. FIGS. 3A to 3E are schematic structural diagrams showing a second photomask process used to form a substrate in the TFT substrate manufacture method shown in FIG. 1.

Figure 3A:
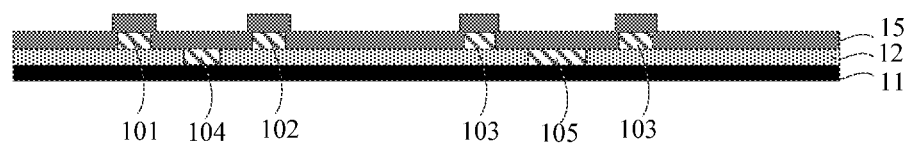
FIGS. 3A to 3E are schematic structural diagrams showing a second photomask process used to form a substrate in the TFT substrate manufacture method shown in FIG. 1.

As shown in FIG. 3A, an insulation material layer 15 is formed on the substrate by using chemical vapor deposition.

Figure 3B:
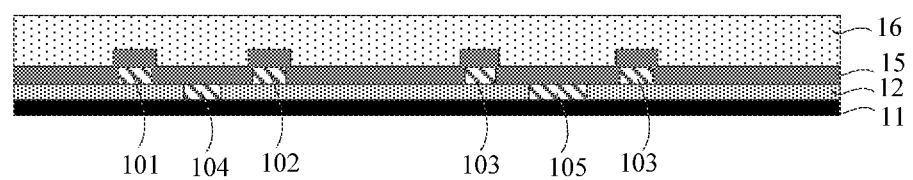
Figure 3C:
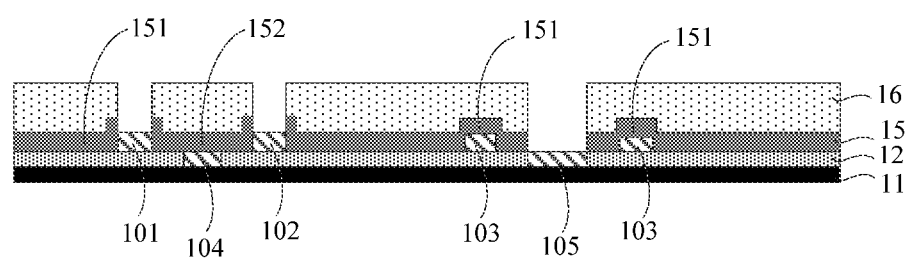

After that, the insulation material layer 15 is patterned. Referring to FIGS. 3B and 3C, a photoresist material 16 is coated on the substrate. A photolithography process is utilized to expose the insulation material layer 15 on the first scan line 101, the second scan line 102, and the source electrode 105 by using a full exposure applied to the photoresist material 16 on the insulation material layer 15 on the first scan line 101, the second scan line 102, and the source electrode 105. An etching process is utilized to etch the insulation material layer 15 on the first scan line 101, the second scan line 102, and the source electrode 105 to form a first insulation layer 151 on the buffer layer 12 and the gate electrode 103 and form a second insulation layer 152 on the data line 104.

Figure 3D:
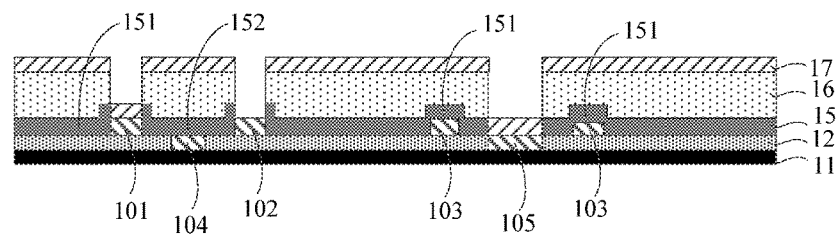

Next, referring to FIG. 3D, physical vapor deposition is utilized to deposit a semiconductor material layer 17 on the entire surface of the substrate to cover the first scan line 101, the second scan line 102, and the source electrode. The material of the semiconductor material layer 17 is indium gallium zinc oxide.

Figure 3E:
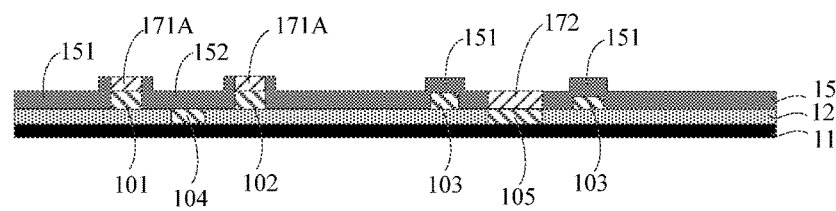

Finally, referring to FIG. 3E, A peeling-off process is utilized to remove the semiconductor layer 17 on the photoresist layer 16 to form a first semiconductor layer 171A on the first scan line 101 and the second scan line 102 and form a second semiconductor layer 172 on the source electrode 105.

Figure 4A:
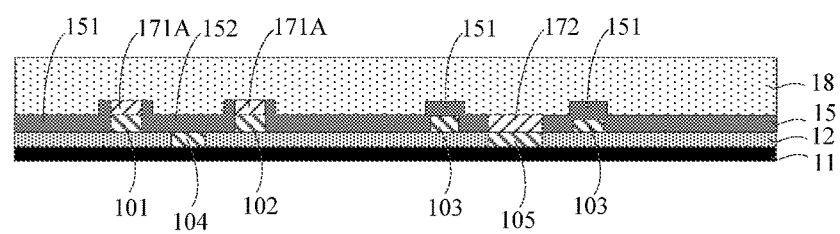
FIGS. 4A to 4F are schematic structural diagrams showing a third photomask process used to form a substrate in the TFT substrate manufacture method shown in FIG. 1.
Figure 4B:
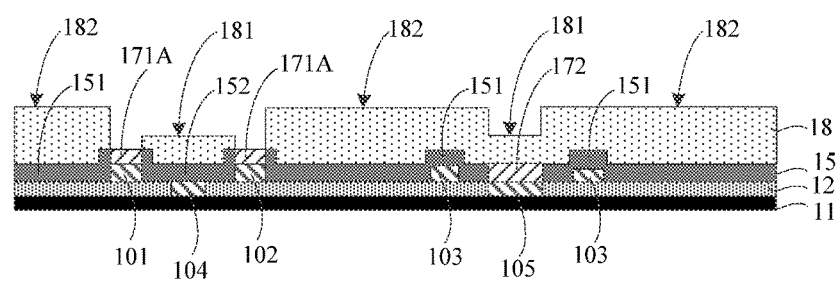
Figure 4C:
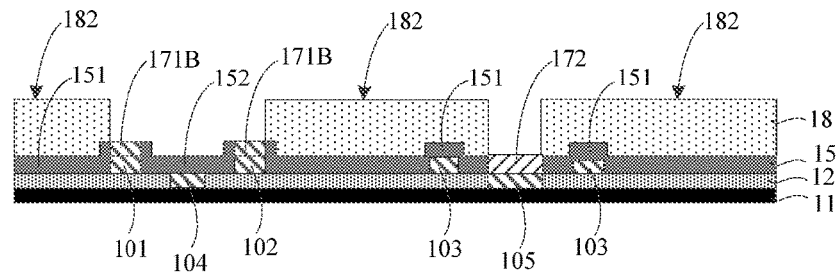
Figure 4D:
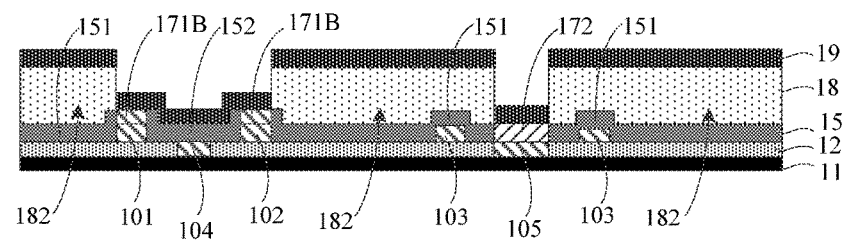
Figure 4E:
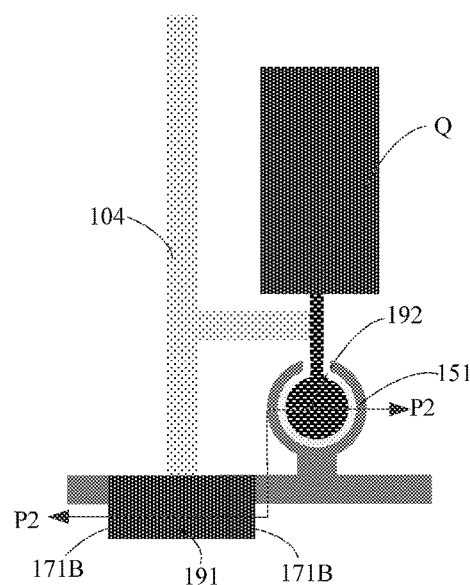
Figure 4F:
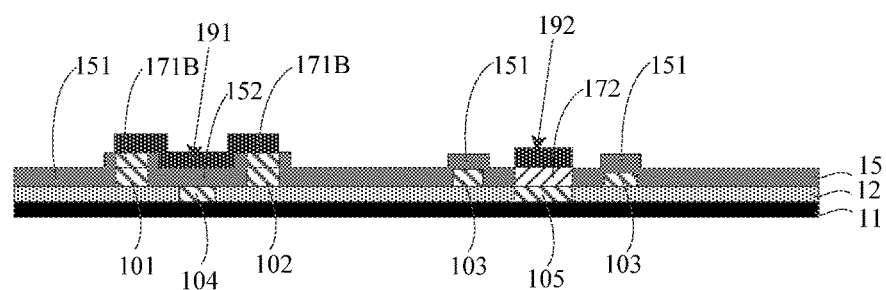

In some embodiments, Steps S103 to S105 are referred to FIGS. 4A to 4F. FIGS. 4A to 4F are schematic structural diagrams showing a third photomask process used to form a substrate in the TFT substrate manufacture method shown in FIG. 1. FIG. 4E is a top view of an array substrate. FIG. 4F is a cross-sectional view of the array substrate along P2-P2 direction.

As shown in FIG. 4A, a photoresist material 18 is coated on the substrate.

After that, referring to FIG. 4B, A half exposure process is utilized to expose the first semiconductor layer 171A by a full exposure applied to the photoresist material on the first semiconductor layer 101. A half exposure process is applied to the photoresist material on the second insulation layer 152 and the second semiconductor layer 172 to form a first photoresist layer 181 on the second insulation layer 152 and the second semiconductor layer 172 (i.e., a half-exposure region) and form a second photoresist layer 182 on the first insulation layer 151 (i.e., a non-exposure region). The thickness of the second photoresist layer 182 is greater than that of the first photoresist layer 181.

Next, referring to FIG. 4C, Argon, nitrogen, and ammonia gases are used to make the exposed first semiconductor layer 171A become a conductor to form a first conductor layer 171B. Then, oxygen is introduced to ash the photoresist material 18 to reduce the overall thickness of the photoresist material 18. All of the photoresist material in the half-exposure region have been reacted so as to remove the first photoresist layer 181.

Next, referring to FIG. 4D, physical vapor deposition is utilized to deposit a second conductor layer 19 on the entire surface of the substrate. The material of the second conductor layer 19 is indium tin oxide.

Finally, referring to FIGS. 4E and 4F, A peeling-off process is utilized to remove the second photoresist layer 182 to form an electrical connection portion 191 on the first conductor layer 171B and the second insulation layer 152 and form a drain electrode 192 on the second semiconductor layer 172 as well as a pixel electrode Q is formed. The electrical connection portion 191 makes the first scan line 101 and the second scan line 102 connected to each other via the first conductor layer 171B.

As can be known from above, in the TFT substrate manufacture method provided in the embodiments of the present disclosure, a first photomask process is utilized to form a buffer layer, a data line, and a source electrode on a substrate and to dispose a first scan line, a second scan line, and a gate electrode on the buffer layer; a second photomask process is utilized to form a first insulation layer on the buffer layer and the gate electrode, form a second insulation layer on the data line, form a first semiconductor layer on the first scan line and the second scan line, and form a second semiconductor layer on the source electrode; a third photomask process is utilized to form a first photoresist layer on the second insulation layer and the second semiconductor layer and form a second photoresist layer on the first insulation layer, and make the first semiconductor layer become a conductor to form a first conductor layer, and form a second conductor layer is on the substrate, and form an electrical connection portion on the first conductor layer and the second insulation layer and form a drain electrode on the second semiconductor layer. This solution uses three photomask processes. The exposed first semiconductor layer becomes a conductor. The overall process is simple, product yield is increased, and the manufacture cost is reduced as well.

Above all, while the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method for manufacturing a TFT (Thin-Film Transistor) substrate, comprising steps of:
   providing a substrate;
   utilizing a first photomask process to form a buffer layer, a data line, and a source electrode on the substrate and dispose a first scan line, a second scan line, and a gate electrode on the buffer layer, the data line configured to electrically connect to the source electrode, the second scan line configured to electrically connect to the gate electrode, and the gate electrode being shaped as a bulk and surrounding the source electrode;

utilizing a second photomask process to form a first insulation layer on the buffer layer and the gate electrode, form a second insulation layer on the data line, form a first semiconductor layer on the first scan line and the second scan line, and form a second semiconductor layer on the source electrode;

coating a photoresist material on the substrate, and utilizing a third photomask process to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer;

making the first semiconductor layer become a conductor to form a first conductor layer, and removing the first photoresist layer;

removing the second photoresist layer after a second conductor layer is formed on the substrate, to form an electrical connection portion on the first conductor layer and the second insulation layer and form a drain electrode on the second semiconductor layer, wherein the electrical connection portion makes the first scan line and the second scan line connected to each other via the first conductor layer.

2. The method according to claim 1, wherein forming the buffer layer, the data line, and the source electrode on the substrate and disposing the first scan line, the second scan line, and the gate electrode on the buffer layer comprising:
forming the buffer layer on the substrate;
coating the photoresist material on the buffer layer;
utilizing a photolithography process and an etching process to form a first scan region, a second scan region, a gate electrode region, a data line region, and a source electrode region;
peeling off the photoresist material after a metal layer is deposited on the substrate, to form the first scan line in the first scan region, form the second scan line in the second scan region, form the gate electrode in the gate electrode region, form the data line in the data line region, and form the source electrode in the source electrode region.

3. The method according to claim 1, wherein forming the first insulation layer on the buffer layer and the gate electrode, forming the second insulation layer on the data line, forming the first semiconductor layer on the first scan line and the second scan line, and forming the second semiconductor layer on the source electrode comprising:
forming an insulation material layer on the substrate;
patterning the insulation material layer to expose the first scan line, the second scan line, and the source electrode, form the first insulation layer on the buffer layer and the gate electrode, and form the second insulation layer on the data line;
forming the first semiconductor layer on the first scan line and the second scan line and forming the second semiconductor layer on the source electrode.

4. The method according to claim 3, wherein patterning the insulation material layer comprising:
coating the photoresist material on the substrate;
utilizing a photolithography process to expose the insulation material layer on the first scan line, the second scan line, and the source electrode by using a full exposure applied to the photoresist material on the insulation material layer on the first scan line, the second scan line, and the source electrode;
utilizing an etching process to etch the insulation material layer on the first scan line, the second scan line, and the source electrode.

5. The method according to claim 4, wherein forming the first semiconductor layer on the first scan line and the second scan line and forming the second semiconductor layer on the source electrode comprising:
utilizing physical vapor deposition to form the first semiconductor layer on the first scan line and the second scan line and form the second semiconductor layer on the source electrode.

6. The method according to claim 1, wherein making the first semiconductor layer become the conductor to form the first conductor layer, and removing the first photoresist layer comprising:
making the first semiconductor layer become the conductor to form the first conductor layer;
ashing the photoresist material to remove the first photoresist layer.

7. The method according to claim 1, wherein removing the second photoresist layer after the second conductor layer is formed on the substrate, comprising:
utilizing physical vapor deposition to deposit the second conductor layer on the substrate;
utilizing a photoresist peeling-off process to remove the second photoresist layer.

8. The method according to claim 1, wherein the material of the first semiconductor layer and the second semiconductor layer comprises indium gallium zinc oxide.

9. The method according to claim 1, wherein the material of the second conductor layer comprises indium tin oxide.

10. The method according to claim 1, wherein the buffer layer is a silicon nitride layer, a silicon oxide layer, or an aluminum oxide layer.

11. A method for manufacturing a TFT (Thin-Film Transistor) substrate, comprising steps of:
providing a substrate;
forming a buffer layer on the substrate and coating a photoresist material on the buffer layer, and utilizing a first photomask process to form a first scan region, a second scan region, a gate electrode region, a data line region, and a source electrode region by a photolithography process and an etching process;
peeling off the photoresist material after a metal layer is deposited on the substrate, to form a first scan line in the first scan region, form a second scan line in the second scan region, form a gate electrode in the gate electrode region, form a data line in the data line region, and form a source electrode in the source electrode region, the data line configured to electrically connect to the source electrode, the second scan line configured to electrically connect to the gate electrode, and the gate electrode being shaped as a bulk and surrounding the source electrode;
forming an insulation material layer on the substrate, and utilizing a second photomask process to pattern the insulation material layer to expose the first scan line, the second scan line, and the source electrode, and to form a first insulation layer on the buffer layer and the gate electrode, form a second insulation layer on the data line, form a first semiconductor layer on the first scan line and the second scan line, and form a second semiconductor layer on the source electrode;
coating the photoresist material on the substrate, and utilizing a third photomask process to expose the first semiconductor layer by a full exposure applied to the photoresist material on the first semiconductor layer, and to form a first photoresist layer on the second insulation layer and the second semiconductor layer and form a second photoresist layer on the first insulation layer by a half exposure applied to the photoresist material on the second insulation layer and the second semiconductor layer;

making the first semiconductor layer become a conductor to form a first conductor layer, and removing the first photoresist layer;

removing the second photoresist layer after a second conductor layer is formed on the substrate, to form an electrical connection portion on the first conductor layer and the second insulation layer and form a drain electrode on the second semiconductor layer, wherein the electrical connection portion makes the first scan line and the second scan line connected to each other via the first conductor layer.

12. The method according to claim 11, wherein patterning the insulation material layer comprising:

coating the photoresist material on the substrate;

Utilizing the photolithography process to expose the insulation material layer on the first scan line, the second scan line, and the source electrode by using a full exposure applied to the photoresist material on the insulation material layer on the first scan line, the second scan line, and the source electrode;

utilizing the etching process to etch the insulation material layer on the first scan line, the second scan line, and the source electrode.

13. The method according to claim 12, wherein forming the first semiconductor layer on the first scan line and the second scan line and forming the second semiconductor layer on the source electrode comprising:

utilizing physical vapor deposition to form the first semiconductor layer on the first scan line and the second scan line and form the second semiconductor layer on the source electrode.

14. The method according to claim 11, wherein making the first semiconductor layer become the conductor to form the first conductor layer, and removing the first photoresist layer comprising:

making the first semiconductor layer become the conductor to form the first conductor layer;

ashing the photoresist material to remove the first photoresist layer.

15. The method according to claim 14, wherein making the first semiconductor layer become the conductor to form the first conductor layer, and removing the first photoresist layer comprising:

Utilizing argon, nitrogen, and ammonia gases to make the first semiconductor layer become the conductor to form the first conductor layer.

16. The method according to claim 11, wherein removing the second photoresist layer after the second conductor layer is formed on the substrate, comprising:

utilizing physical vapor deposition to deposit the second conductor layer on the substrate;

utilizing a photoresist peeling-off process to remove the second photoresist layer.

17. The method according to claim 11, wherein the material of the first semiconductor layer and the second semiconductor layer comprises indium gallium zinc oxide.

18. The method according to claim 11, wherein the material of the second conductor layer comprises indium tin oxide.

19. The method according to claim 11, wherein the buffer layer is a silicon nitride layer, a silicon oxide layer, or an aluminum oxide layer.

20. The method according to claim 11, wherein a thickness of the second photoresist layer is greater than that of the first photoresist layer.

* * * * *